(12) United States Patent
Cheon

(10) Patent No.: US 7,457,179 B2
(45) Date of Patent: Nov. 25, 2008

(54) SEMICONDUCTOR MEMORY DEVICE, SYSTEM AND METHOD OF TESTING SAME

(75) Inventor: Kwun-Soo Cheon, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 54 days.

(21) Appl. No.: 11/620,096

(22) Filed: Jan. 5, 2007

(65) Prior Publication Data

US 2007/0171759 A1  Jul. 26, 2007

(30) Foreign Application Priority Data

Jan. 24, 2006  (KR) ............... 10-2006-0007368

(51) Int. Cl.
*G11C 7/00* (2006.01)
*G11C 29/00* (2006.01)
*G11C 7/10* (2006.01)
*G11C 8/00* (2006.01)

(52) U.S. Cl. .............. 365/201; 365/194; 365/189.05; 365/230.08

(58) Field of Classification Search .......... 365/189.05, 365/194, 201, 230.08
See application file for complete search history.

(56) References Cited

U.S. PATENT DOCUMENTS 5,477,490 A * 12/1995 Miyawaki et al. ........ 365/194
6,629,224 B1   9/2003 Suzuki et al.
7,106,648 B2 * 9/2006 You .................... 365/230.06

FOREIGN PATENT DOCUMENTS

JP         11-306796    11/1999
KR         1999-010047   2/1999

* cited by examiner

*Primary Examiner*—Ly D Pham
(74) *Attorney, Agent, or Firm*—F. Chau & Associates, LLC

(57) ABSTRACT

A semiconductor memory device includes a plurality of address pads, a plurality of DQ pads, an address buffer, a data input buffer, a latch circuit and a first delay circuit. The address buffer receives a plurality of first address signals through the address pads and buffers the first address signals to generate a plurality of second address signals. The data input buffer receives one of a plurality of input data through the DQ pads and buffers the input data to generate a first data or receives the first address signals through the DQ pads and buffers the address signals to generate a plurality of third address signals. The latch circuit latches the third address signals to generate fourth address signals in response to a test mode control signal. The first delay circuit selects the second address signals or the fourth address signals and delays the selected address signals for a predetermined time to generate fifth address signals.

17 Claims, 11 Drawing Sheets

SEMICONDUCTOR MEMORY DEVICE, SYSTEM AND METHOD OF TESTING SAME

CROSS-REFERENCE TO RELATED PATENT APPLICATION

This application claims priority under 35 U.S.C. § 119 to Korean Patent Application No. 2006-7368, filed on Jan. 24, 2006, the contents of which are herein incorporated by reference in their entirety.

BACKGROUND OF THE INVENTION

1. Technical Field

The present disclosure relates to a semiconductor memory device and, more particularly, to a semiconductor memory device and a system and method of testing the semiconductor memory device.

2. Discussion of Related Art

To test a semiconductor memory device, a tester may provide address signals to the semiconductor memory device through address pins, command signals through command pins, and data through DQ pins.

In general, the tester is comprised of a limited number of channels. Therefore, as the number of pins of a semiconductor memory device used for a test is increased, the number of semiconductor memory devices that can be tested at the same time may be decreased.

There exists a need for a method to increase the number of semiconductor memory devices that may be tested simultaneously.

SUMMARY OF THE INVENTION

According to an exemplary embodiment of the present invention, a semiconductor memory device includes a plurality of address pads, a plurality of DQ pads, an address buffer, a data input buffer, a latch circuit and a first delay circuit. The address buffer receives a plurality of first address signals through the address pads and buffers the first address signals to generate a plurality of second address signals. The data input buffer receives one of a plurality of input data through the DQ pads and buffers the input data to generate a first data or receives the first address signals through the DQ pads and buffers the address signals to generate a plurality of third address signals. The latch circuit latches the third address signals to generate fourth address signals in response to a test mode control signal. The first delay circuit selects the second address signals or the fourth address signals and delays the selected address signals for a predetermined time to generate fifth address signals.

According to an exemplary embodiment of the present invention, a semiconductor memory device includes a plurality of command pads, a plurality of DQ pads, a command buffer, a data input buffer, a latch circuit and a first delay circuit. The command buffer receives a plurality of first command signals through the plurality of command pads and buffers the plurality of command signals to generate second command signals. The data input buffer receives a plurality of input data through the DQ pads and buffers the plurality of input data to generate a first data, or receives the plurality of command signals through the DQ pads and buffers the first command signals to generate third command signals. The latch circuit latches the third command signals to generate fourth command signals in response to a test mode control signal. The first delay circuit selects the second command signals or the fourth command signals and delays the selected address signals for a predetermined time to generate fifth command signals.

According to an exemplary embodiment of the present invention, a semiconductor memory device includes a plurality of address pads, a plurality of command pads, a plurality of DQ pads, an address buffer, a command buffer, a data input buffer, a latch circuit, a first delay circuit and a second delay circuit. The address buffer receives a plurality of first address signals through the address pads and buffers the first address signals to generate second address signals. The command buffer receives at least one first command signal through the command pads, and buffers the at least one first command signal to generate second command signals. The data input buffer receives a plurality of input data through the DQ pads and buffers the plurality of input data to generate a first data, or receives the first address signals and at least one third command signal through the plurality of DQ pads and buffers the plurality of address signals and the at least one third command signal to generate third address signals and fourth command signals. The latch circuit latches the third address signals and the fourth command signals to generate fourth address signals and fifth command signals in response to a test mode control signal. The first delay circuit selects the second address signals or the fourth address signals, and delays the selected address signals for a predetermined time to generate fifth address signals. The second delay circuit selects the second command signals or the fifth command signals, and delays the selected address signals by a predetermined time to generate sixth command signals.

According to an exemplary embodiment of the present invention, a semiconductor memory test system includes a semiconductor memory device and a tester. The semiconductor memory device includes a plurality of address pads, a plurality of command pads and a plurality of DQ pads. The tester provides address signals, command signals and input data to the semiconductor memory device through the DQ pads, and tests operations of the semiconductor memory device According to an exemplary embodiment of the present invention, a method of testing a semiconductor memory device includes receiving a plurality of address signals and at least one command signal from a tester through a plurality of DQ pads, receiving a plurality of input data from the tester through the DQ pads, buffering the address signals and the at least one command signal to generate first address signals and first command signals, latching the first address signals and the first command signals to generate second address signals and second command signals in a test mode, delaying the second address signals for a predetermined time to generate third address signals in the test mode, delaying the second command signals for a predetermined time to generate third command signals in the test mode, writing the input data to a memory core based on the third address signals and the third command signals in the test mode, and reading data stored in the memory core based on the third address signals and the third command signals in the test mode.

BRIEF DESCRIPTION OF THE DRAWINGS

The present invention will become more apparent to those of ordinary skill in the art when descriptions of exemplary embodiments thereof are read with reference to the accompanying drawings.

DESCRIPTION OF EXEMPLARY EMBODIMENTS

Figure 1:
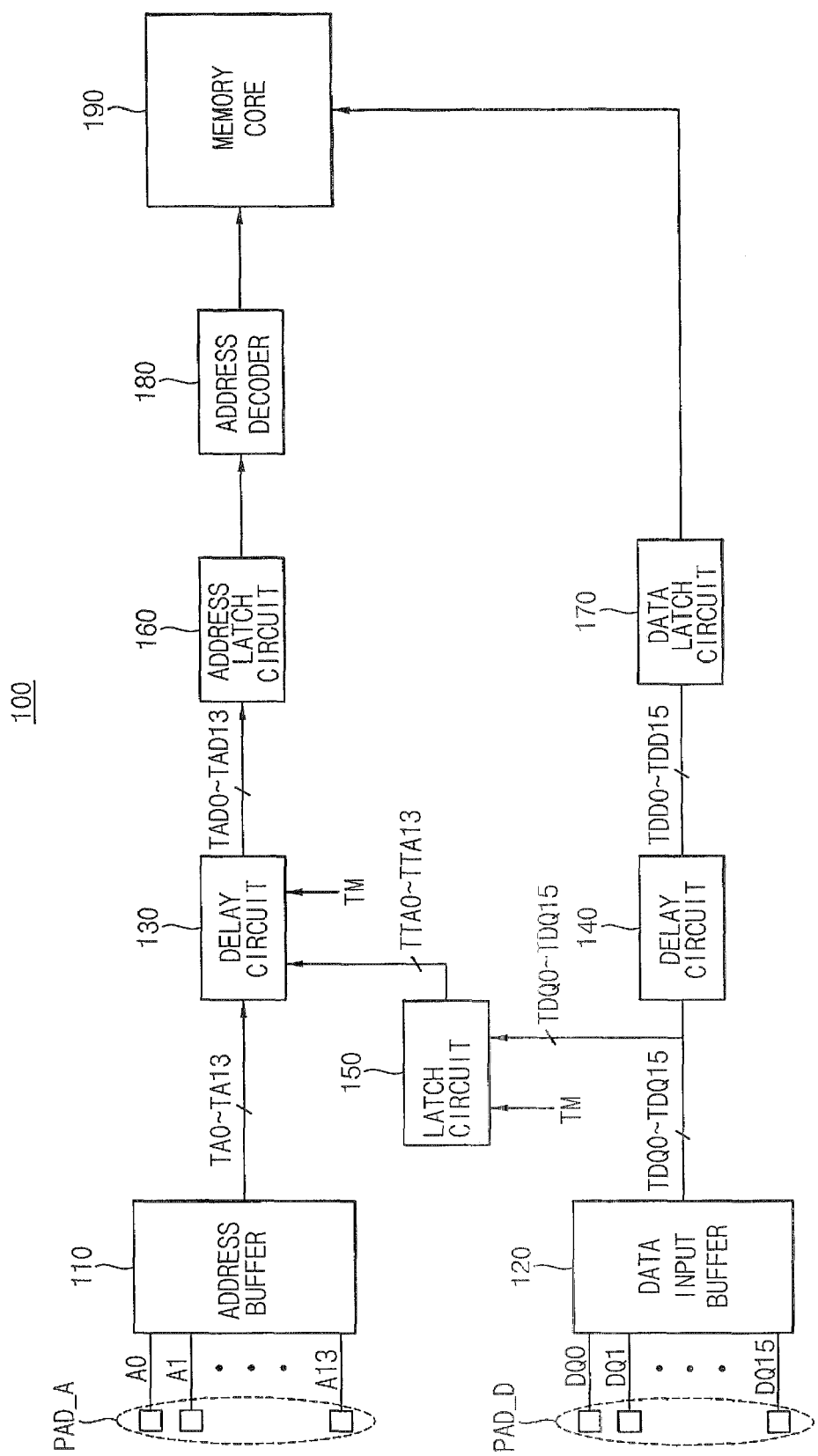
FIG. 1 is a block diagram illustrating a semiconductor memory device according to an exemplary embodiment of the present invention.

Exemplary embodiments of the present invention will be described in detail with reference to the accompanying drawings. Like reference numerals refer to similar or identical elements throughout the description of the figures.

FIG. 1 is a block diagram illustrating a semiconductor memory device according to an exemplary embodiment of the present invention.

Referring to FIG. 1, the semiconductor memory device 100 includes a plurality of address pads PAD_A, a plurality of DQ pads PAD_D, an address buffer 110, a data input buffer 120, a latch circuit 150, a first delay circuit 130, and a second delay circuit 140.

The address pads PAD_A are electrically coupled to address pins (not shown), and the DQ pads PAD_D are electrically coupled to DQ pins (not shown). In an exemplary embodiment of the present invention, the address buffer 110 receives address signals A0 to A13 through the address pads PAD_A and buffers the address signals A0 to A13. The data input buffer 120 may receive input data DQ0 to DQ15 through the DQ pads PAD_D and may buffer the input data DQ0 to DQ15, or may receive the address signals A0 to A13 through the DQ pads PAD_D and may buffer the address signals A0 to A13. The output signals TDQ0 to TDQ15 of the data input buffers 120 may be the input data DQ0 to DQ15 or the address signals A0 to A13. The latch circuit 150 may receive signals TDQ0 to TDQ15 and may latch the signals TDQ0 to TDQ13, which correspond to the address signals A0 to A13, in response to the test mode control signal TM.

The first delay circuit 130 selects the output signals TA0 to TA13 of the address buffer 110 or the output signals TTA0 to TTA13 of the latch circuit 150, and delays the selected address signals for a predetermined time to generate delayed address signals TAD0 to TAD13 in response to the test mode control signal TM. The second delay circuit 140 delays the output signals TDQ0 to TDQ15 of the data input buffer 120 for a predetermined time to generate delayed data TDD0 to TDD15.

In an exemplary embodiment of the present invention, the semiconductor memory device 100 includes an address latch circuit 160, an address decoder 180S a data latch circuit 170 and a memory core 190 including a memory cell array. The address latch circuit 160 latches the delayed address signals TAD0 to TAD13, and the address decoder 180 decodes output signals of the address latch circuit 160 to generate decoded address signals and provides the decoded address signals to the memory core 190. The data latch circuit 170 latches the delayed data TDD0 to TDD15 and provides the latched data to the memory core 190. The output data of the data latch circuit 170 are stored in selected memory cells of the memory cell array based on the decoded address signals decoded by the address decoder 180.

Hereinafter, operations of the semiconductor memory device 100 according to an exemplary embodiment of the present invention will be described with reference to FIG. 1.

In a normal mode, the address signals A0 to A13 are inputted through the address pads PAD_A and the input data DQ0 to DQ15 are inputted through the DQ pads PAD_D. The address signals A0 to A13 are buffered by the address buffer 110 and delayed for a predetermined time by the first delay circuit 130 and provided to the address latch circuit 160. The input data DQ0 to DQ15 are buffered by the data input buffer 120 and delayed for a predetermined time by the second delay circuit 140 and provided to the data latch circuit 170. Output signals of the address latch circuit 160 are decoded by the address decoder 180 and provided to the memory core 190. The data stored temporarily in the data latch circuit 170 are stored in the memory cell array of the memory core 190 in response to the address signals decoded by the address decoder 180. In a test mode, although not shown as such in FIG. 1, the address signals A0 to A13 and the input data DQ0 to DQ15 are inputted through the DQ pads PAD_D. The address signals A0 to A13 are buffered by the data input buffer 120 and latched by the latch circuit 150. The first delay circuit 130 delays the output signals TTA0 to TTA13 of the latch circuit 150, which correspond to address signals A0 to A13, for a predetermined time and provides the delayed address signals to the address latch circuit 160. The input data DQ0 to DQ15 are buffered by the data input buffer 120, delayed for a predetermined time by the second delay circuit 140, and provided to the data latch circuit 170. The output signals of the address latch circuit 160 are decoded by the address decoder 180 and provided to the memory core 190. The data stored temporarily in the data latch circuit 170 are stored in the memory cell array of the memory core 190 in response to the address signals decoded by the address decoder 180. The data stored in the memory core 190 may be outputted through an output buffer (not shown) and the DQ pads PAD_D during a data read operation.

According to an exemplary embodiment of the present invention, in the test mode, test efficiency of a semiconductor memory device may be increased by applying address signals through the DQ pads PAD_D rather than the address pads PAD_A. For example, a test system including the semiconductor memory device 100 described in connection with FIG. 1 may test an increased number of semiconductor memory devices in a given time, FIG. 2 is a block diagram illustrating the latch circuit 150 and the first delay circuit 130 of the semiconductor memory device shown in FIG. 1, according to an exemplary embodiment of the present invention.

Figure 2:
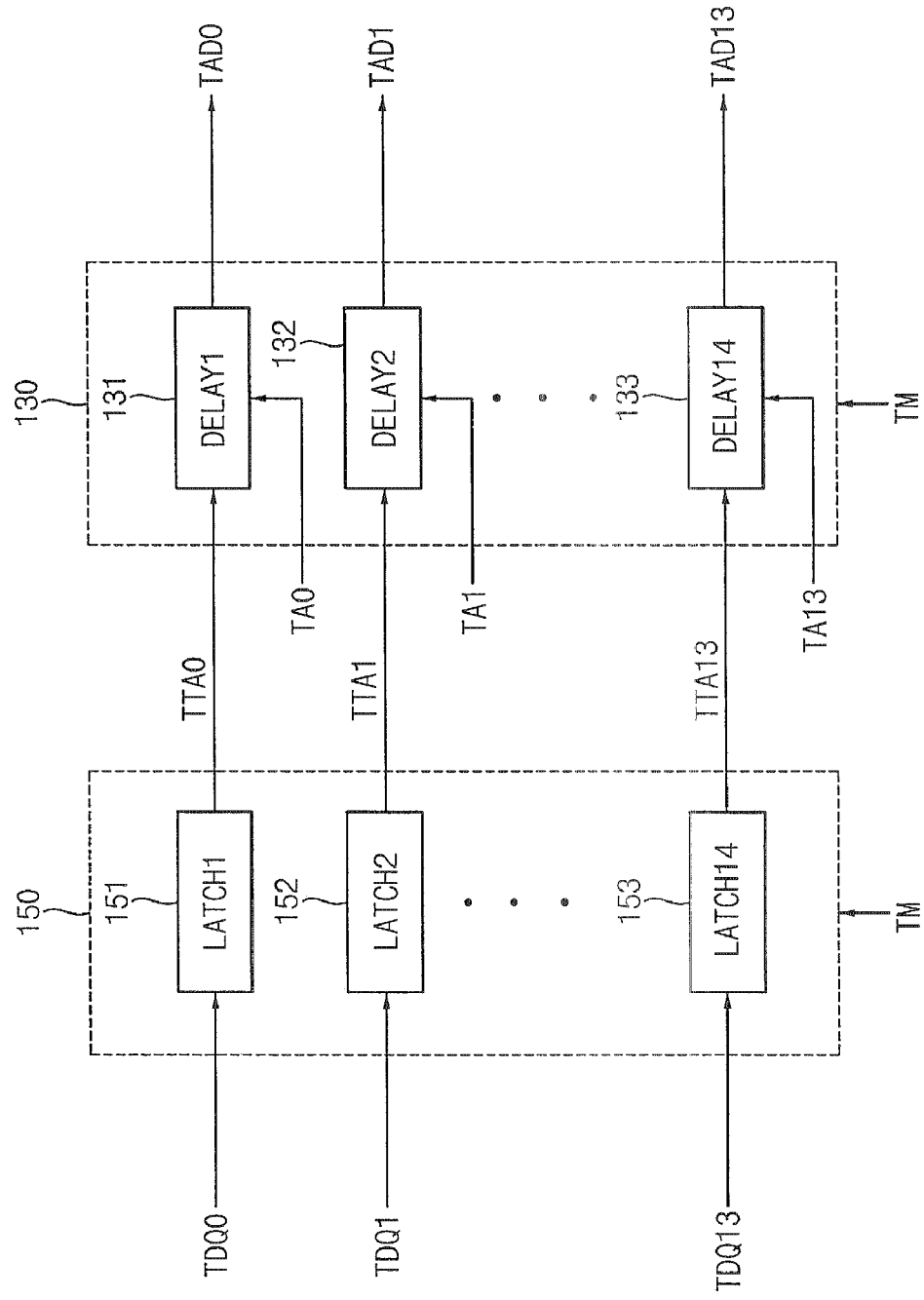
FIG. 2 is a block diagram illustrating a latch circuit and a delay circuit of the semiconductor memory device shown in FIG. 1.

Referring to FIG. 2, the latch circuit 150 includes a plurality of unit latch circuits, such as for example, a first unit latch circuit 151, a second unit latch circuit 152, and a third unit latch circuit 153. The first unit latch circuit (LATCH1) 151 receives and latches the signal TDQ0 to output the signal TTA0 in response to the test mode control signal TM. The second unit latch circuit (LATCH2) 152 receives and latches the signal TDQ1 to output the signal TTA1 in response to the test mode control signal TM. The third unit latch circuit (LATCH14) 153 receives and latches the signal TDQ13 to output the signal TTA13 in response to the test mode control signal TM.

The first delay circuit 130 includes a plurality of unit delay circuits, such as for example, a first unit delay circuit 131, a second unit delay circuit 132, and a third unit delay circuit 133. The first unit delay circuit (DELAY1) 131 selects an output signal TA0 of the address buffer 110 of FIG. 1 or an output signal TTA0 of the latch circuit 150, and delays the selected signal for a predetermined time to generate the delayed address signal TAD0 in response to the test mode control signal TM. The second unit delay circuit (DELAY2) 132 selects an output signal TA1 of the address buffer 110 of FIG. 1 or an output signal TTA1 of the latch circuit 150, and delays the selected signal for a predetermined time to generate the delayed address signal TAD1 in response to the test mode control signal TM.

The third unit delay circuit (DELAY14) 133 selects an output signal TA13 of the address buffer 110 of FIG. 1 or an output signal TTA13 of the latch circuit tats 150, and delays the selected signal for a predetermined time to generate the delayed address signal TAD13 in response to the test mode control signal TM.

Figure 3:
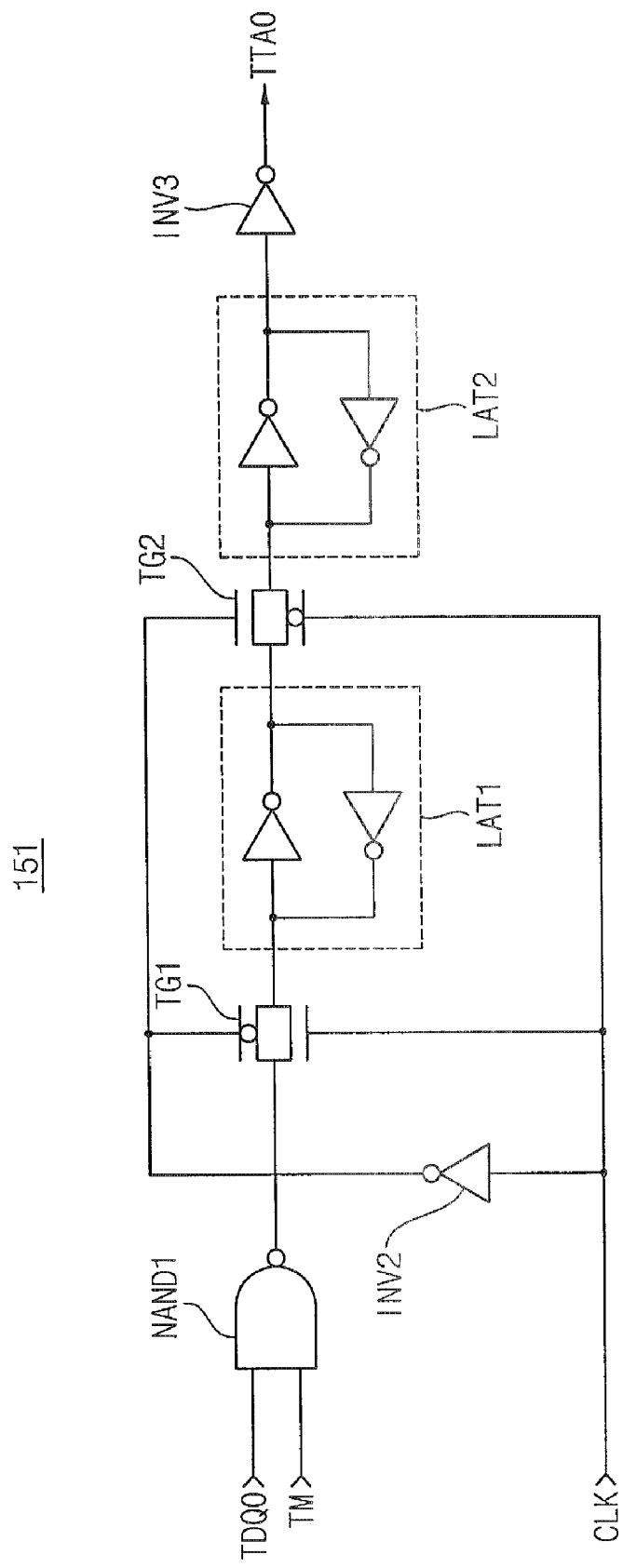
FIG. 3 is a circuit diagram illustrating a unit latch circuit of the latch circuit shown in FIG. 2, according to an exemplary embodiment of the present invention.

FIG. 3 is a circuit diagram illustrating the first unit latch circuit 151 of the latch circuit 150 shown in FIG. 2, according to an exemplary embodiment of the present invention. Referring to FIG. 3, the first unit latch circuit (LATCH1) 151 includes a NAND gate NAND1, a first transmission gate TG1, a second transmission gate TG2, a first latch LAT1, a second latch LAT2, a first inverter INV2 and a second inverter INV3.

The NAND gate NAND1 performs a logical NAND operation on the output signal TDQ0 of the data input buffer 120, described in connection with FIG. 1, and the test mode control signal TM. The first inverter INV2 inverts the clock signal CLK. The first transmission gate TG1 outputs the output signal of the NAND gate NAND1 in response to the clock signal CLK and the output signal of the first inverter INV2. The first latch LAT1 latches the output signal of the first transmission gate TG1. The second transmission gate TG2 outputs the output signal of the first latch LAT1 in response to the clock signal CLK and the output signal of the first inverter INV2. The second latch LAT2 latches the output signal of the second transmission gate TG2, and the second inverter INV3 inverts the output signal of the second latch LAT2.

When the test mode control signal TM is enabled, for example, in the case when the test mode control signal TM has a logic "high" level, the first unit latch circuit 151 temporarily stores the output signal TDQ0 of the data input buffer 120 of FIG. 1 in the first latch LAT1 or in the second latch LAT2. When the clock signal CLK has a logic "high" level the first transmission gate TG1 is turned on and the second transmission gate TG2 is turned off. At this time, the output signal of the NAND gate NAND1 is stored in the latch LAT1. When the clock signal CLK has a logic "low" level, the first transmission gate TG1 is turned off and the second transmission gate TG2 is turned on. At this time, the data stored in the first latch LAT1 is outputted and stored in the second latch LAT2.

Figure 4:
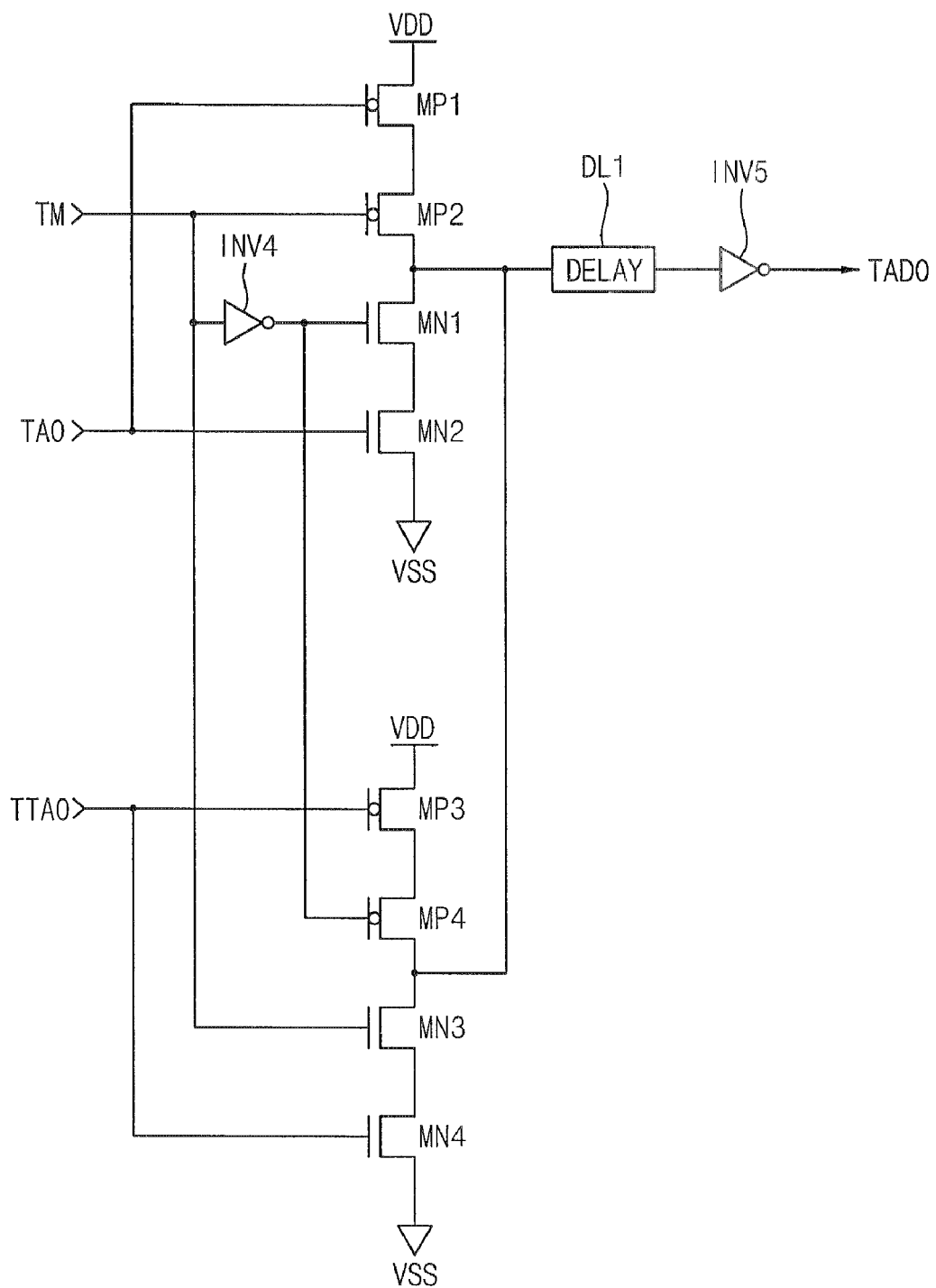
FIG. 4 is a circuit diagram illustrating a unit delay circuit of the delay circuit shown in FIG. 2, according to an exemplary embodiment of the present invention.

FIG. 4 is a circuit diagram illustrating the first unit delay circuit (DELAY1) 131 of the delay circuit 130 shown in FIG. 2, according to an exemplary embodiment of the present invention.

Referring to FIG. 4, the first unit delay circuit (DELAY1) 131 includes a first PMOS transistor MP1, a second PMOS transistor MP2, a third PMOS transistor MP3, a fourth PMOS transistor MP4, a first NMOS transistor MN1, a second NMOS transistor MN2, a third NMOS transistor MN3, a fourth NMOS transistor MN4, a delay DL1, a first inverter INV4, and a second inverter INV5.

Hereinafter, operations of the first unit delay circuit (DELAY1) 131 of the delay circuit 130 shown in FIG. 2 will be described with reference to FIG. 4.

The first PMOS transistor MP1 the second PMOS transistor MP2, the first NMOS transistor MN1 and the second NMOS transistor MN2 operate in the normal mode. The third PMOS transistor MP3, the fourth PMOS transistor MP4, the third NMOS transistor MN3, and the third NMOS transistor MN4 operate in the test mode.

Referring to FIG. 4, in an exemplary embodiment of the present invention, when the test mode control signal TM has a logic "low" level, the second PMOS transistor MP2 and the first NMOS transistor MN1 are turned on, and the fourth PMOS transistor MP4 and the third NMOS transistor MN3 are turned off. Therefore, when the test mode control signal TM has a logic "low" level, the output signal TA0 of the address buffer 110 is outputted as a delayed address signal TAD0, and the output signal TTA0 of the latch circuit 150 is not outputted, that is, because the fourth PMOS transistor MP4 and the third NMOS transistor MN3 are turned off. The delay DL1 delays the drain voltage of the first NMOS transistor MN1, or the drain voltage of the third NMOS transistor MN3, for a predetermined time. The inverter INV5 inverts the output signal of the delay DL1.

Figure 5:
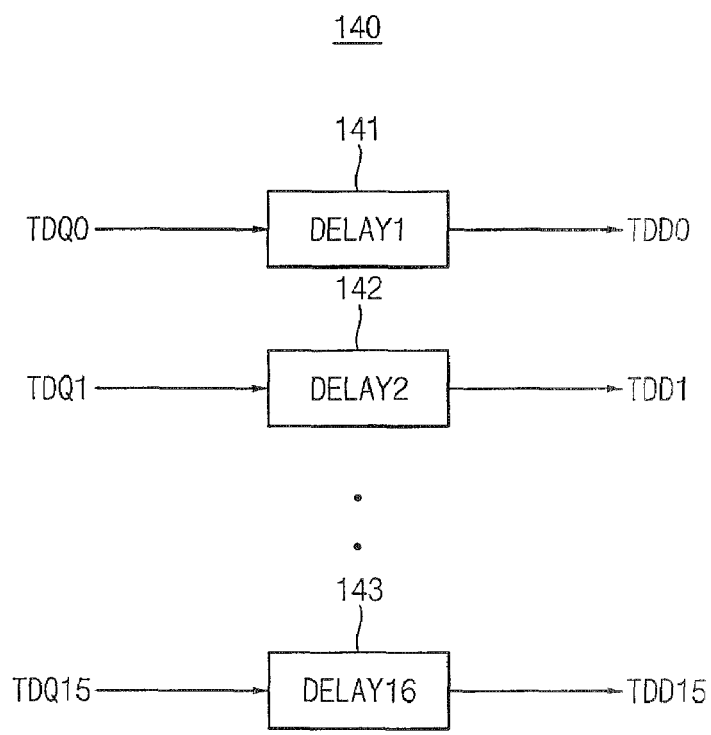
FIG. 5 is a block diagram illustrating a delay circuit of the semiconductor memory device shown in FIG. 1, according to an exemplary embodiment of the present invention.

FIG. 5 is a block diagram illustrating the second delay circuit 140 of the semiconductor memory device shown in FIG. 1, according to an exemplary embodiment of the present invention.

Referring to FIG. 5, the second delay circuit 140 includes a plurality of unit delay circuits, such as for example, a first unit delay circuit 141, a second unit delay circuit 142, and a third unit delay circuit 143. The first unit delay circuit (DELAY1) 141 delays the output signal TDQ0 of the data input buffer 120, described in connection with FIG. 1, for a predetermined time to generate the delayed data TDD0. The second unit delay circuit (DELAY2) 142 delays the output signal TDQ1 of the data input buffer 120 of FIG. 1 for a predetermined time to generate the delayed data TDD1. The third unit delay circuit (DELAY16) 143 delays the output signal TDQ15 of the data input buffer 120 of FIG. 1 for a predetermined time to generate the delayed data TDD15.

Figure 6:
FIG. 6 is a circuit diagram illustrating a unit delay circuit of the delay circuit shown in FIG. 5, according to an exemplary embodiment of the present invention.

FIG. 6 is a circuit diagram illustrating the first unit delay circuit 141 of the second delay circuit 140 shown in FIG. 5, according to an exemplary embodiment of the present invention. Referring to FIG. 6, the unit delay circuit (DELAY1) 141 includes two inverters INV6 and INV7.

Figure 7:
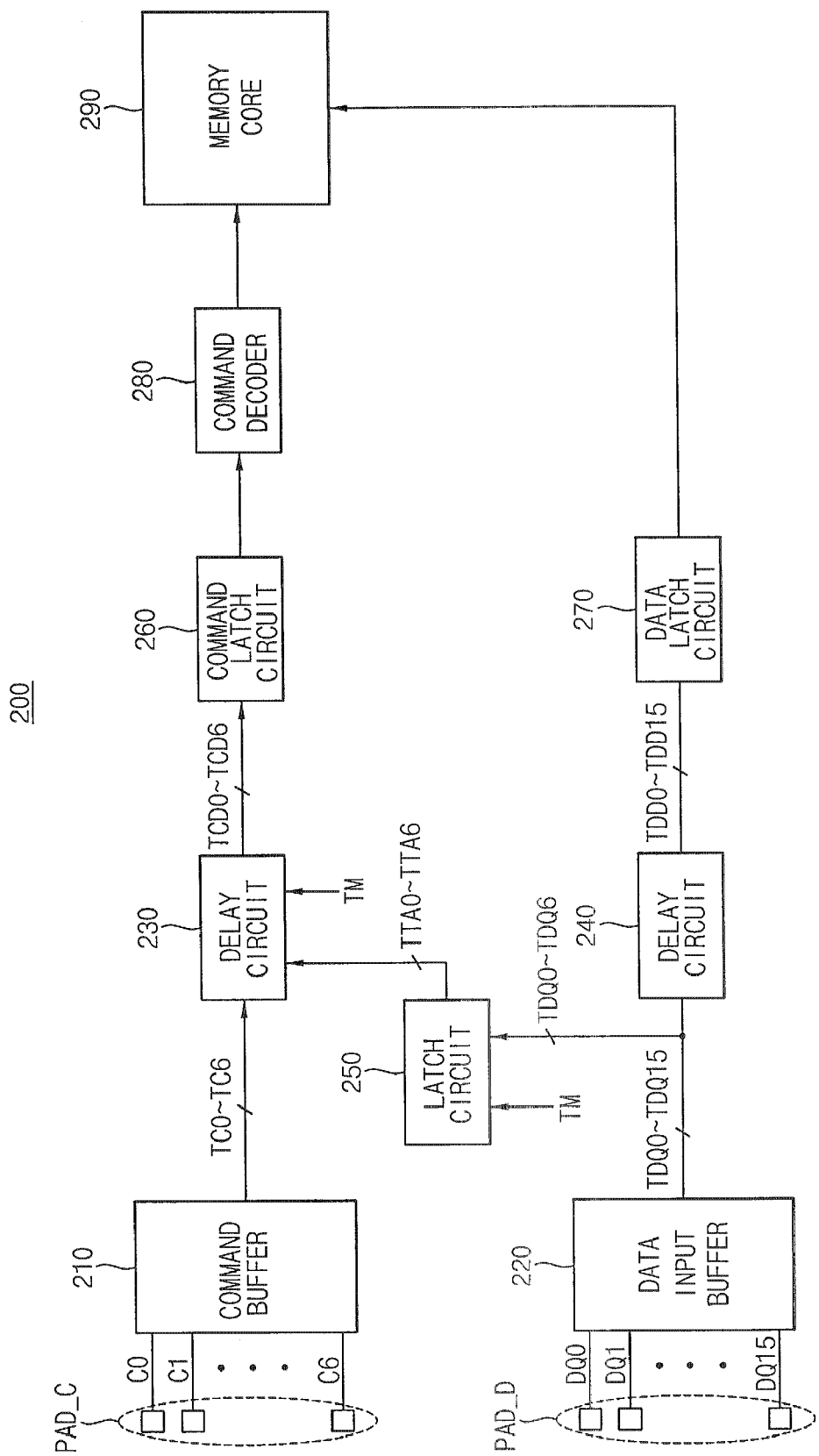
FIG. 7 is a block diagram illustrating a semiconductor memory device according to an exemplary embodiment of the present invention.

FIG. 7 is a block diagram illustrating a semiconductor memory device according to an exemplary embodiment of the present invention.

Referring to FIG. 7, the semiconductor memory device 200 includes a plurality of command pads PAD_C, a plurality of DQ pads PAD_D, a command buffer 210, a data input buffer 220, a latch circuit 250, a first delay circuit 230 and a second delay circuit 240.

The command pads PAD_C are electrically coupled to command pins (not shown), and the DQ pads PAD_D are electrically coupled to DQ pins (not shown). In an exemplary embodiment of the present invention, the command buffer 210 receives command signals C0 to C6 through command pads PAD_C and buffers the command signals C0 to C6. The data input buffer 220 may receive input data DQ0 to DQ15 through the DQ pads PAD_D and may buffer the input data DQ0 to DQ15, or may receive the command signals C0 to C6 through the DQ pads PAD_D and may buffer the command signals C0 to C6. The output signals TDQ0 to TDQ15 of the data input buffer 220 may be the input data DQ0 to DQ15 or the command signals C0 to C6. The latch circuit 250 may receive signals TDQ0 to TDQ15 and may latch the signals TDQ0 to TDQ6, which correspond to command signals C0 to C6, in response to the test mode control signal TM.

The first delay circuit 230 selects the output signals TC0 to TC6 of the command buffer 210 or the output signals TTA0 to TTA6 of the latch circuit 250, and delays the selected address signals for a predetermined time to generate delayed command signals TCD0 to TCD6 in response to the test mode control signal TM. The second delay circuit 240 delays the output signals TDQ0 to TDQ15 of the data input buffer 220 for a predetermined time to generate delayed data TDD0 to TDD15.

In an exemplary embodiment of the present invention, the semiconductor memory device 200 includes a command latch circuit 260, a command decoder 280, a data latch circuit 270 and a memory core 290 including a memory cell array. The command latch circuit 260 latches the delayed command signals TCD0 to TCD6. The command decoder 280 decodes output signals of the command latch circuit 260 to generate decoded command signals and provides the decoded command signals to the memory core 290. The data latch circuit 270 latches the delayed data TDD0 to TDD15 and provides the latched data to the memory core 290. The output data of the data latch circuit 270 are stored in selected memory cells of the memory cell array based on the decoded address signals decoded by the address decoder 280.

Hereinafter, operations of the semiconductor memory device 200 according to an exemplary embodiment of the present invention will be described with reference to FIG. 7.

In a normal mode, the command signals C0 to C6 are inputted through the command pads PAD_C and the input data DQ0 to DQ15 are inputted through the DQ pads PAD_D. For example the command signals C0 to C6 may include a clock signal CLK, an inverted clock signal CLKB, a chip selection signal CSB, a row address strobe signal RASB, a column address strobe signal CASB, a write enable signal WEB and/or a clock enable signal CKE.

The command signals C0 to C6 are buffered by the command buffer 210, delayed for a predetermined time by the first delay circuit 230, and provided to the command latch circuit 260. The input data DQ0 to DQ15 are buffered by the data input buffer 220, delayed for a predetermined time by the second delay circuit 240, and provided to the data latch circuit 270. The output signals of the command latch circuit 260 are decoded by the command decoder 280 and provided to the memory core 290. The data stored temporarily in the data latch circuit 270 are stored in the memory cell array of the memory core 290 in response to decoded address signals (not shown) and command signals decoded by the command decoder 280. In FIG. 7, only a path of the input data is shown, and a path of the output data is not shown.

In a test mode, although not shown as such in FIG. 7, the command signals C0 to C6 and the input data DQ0 to DQ15 are inputted through DQ pads PAD_D. The command signals C0 to C6 are buffered by the data input buffer 220 and latched by the latch circuit 250. The delay circuit 230 delays the output signals TTA0 to TTA6 of the latch circuit 250, which correspond to command signals C0 to C6, for a predetermined time and provides the delayed command signal to the command latch circuit 260. The input data DQ0 to DQ15 are buffered by the data input buffer 220, delayed for a predetermined time by the delay circuit 240, and provided to the data latch circuit 270. The output signals of the command latch circuit 260 are decoded by the command decoder 280. The data stored temporarily in the data latch circuit 270 are stored in the memory cell array included in the memory core 290 in response to the decoded row address signals (not shown) and the command signals decoded by the command decoder 280. The data stored in the memory core 290 are outputted through the output buffer (not shown) and DQ pads PAD_D during the data read operation.

According to an exemplary embodiment of the present invention, in the test mode, test efficiency of a semiconductor memory device may be increased by applying command signals through the DQ pads PAD_D rather than the command pads PAD_C. For example, a test system including the semiconductor memory device 200 described in connection with FIG. 7 may test an increased number of semiconductor memory devices in a given time.

Figure 8:
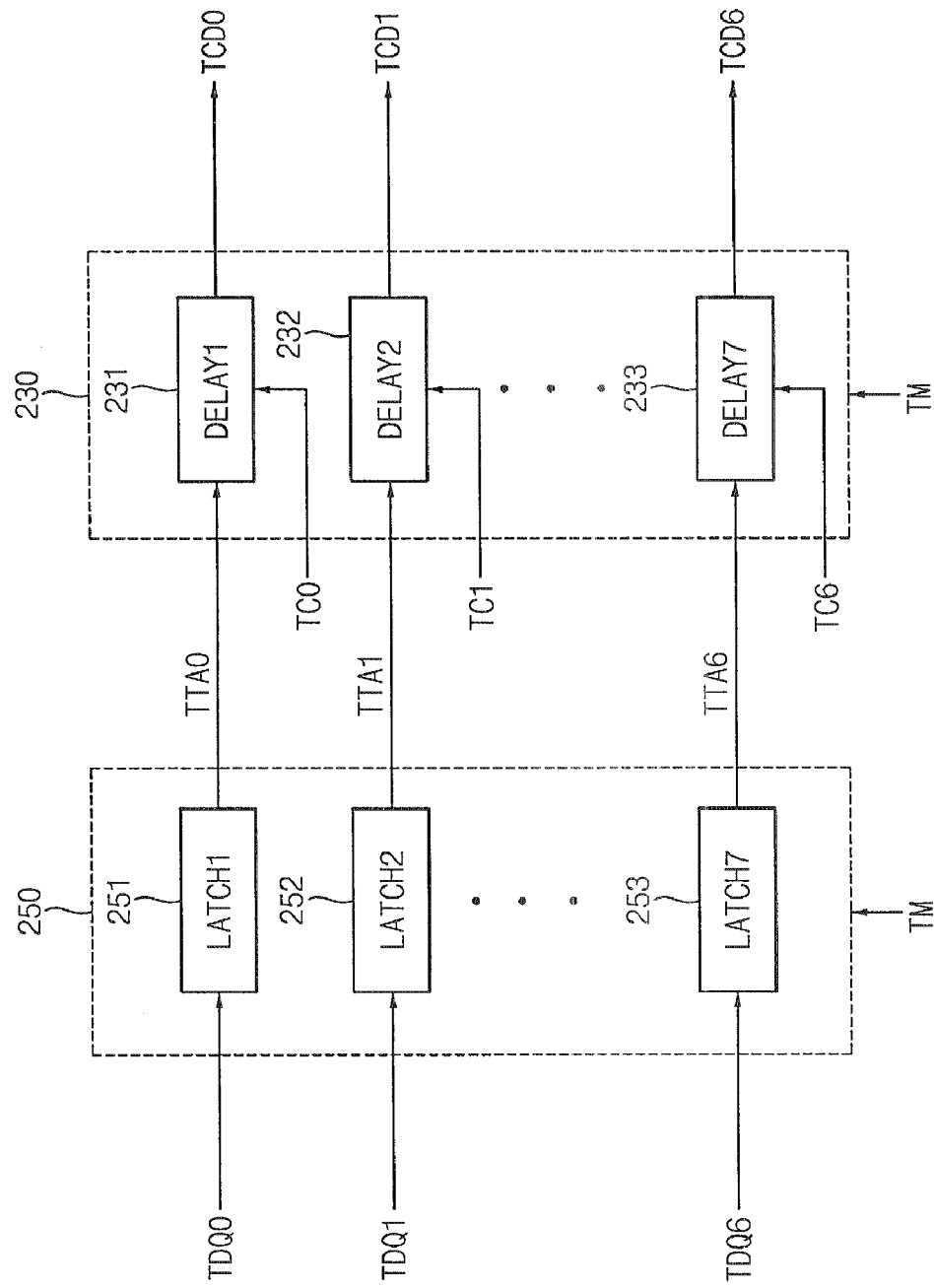
FIG. 8 is a block diagram illustrating a latch circuit and a delay circuit of the semiconductor memory device in shown FIG. 7, according to an exemplary embodiment of the present invention.

FIG. 8 is a block diagram illustrating the latch circuit 250 and the first delay circuit 230 of the semiconductor memory device shown in FIG. 7, according to an exemplary embodiment of the present invention.

Referring to FIG. 8, the latch circuit 250 includes a plurality of unit latch circuits, such as for example, a first unit latch circuit 251, a second unit latch circuit 252, and a third unit latch circuit 253. The first unit latch circuit (LATCH1) 251 receives and latches the signal TDQ0 to output the signal TTA0 in response to the test mode control signal TM. The second unit latch circuit (LATCH2) 252 receives and latches the signal TDQ1 to output the signal TTA1 in response to the test mode control signal TM. The third unit latch circuit (LATCH7) 253 receives and latches the signal TDQ6 to output the signal TTA6 in response to the test mode control signal TM.

The first delay circuit 230 includes a plurality of unit delay circuits, such as for example, a first unit delay circuit 231, a second unit delay circuit 232, and a third unit delay circuit 233. The first unit delay circuit (DELAY1) 231 selects an output signal TC0 of the command buffer 210 of FIG. 7 or an output signal TTA0 of the latch circuit 250, and delays the selected signal for a predetermined time to generate the delayed command signal TCD0 in response to the test mode control signal TM. The second unit delay circuit (DELAY2) 232 selects an output signal TC1 of the command buffer 210 of FIG. 7 or an output signal TTA1 of the latch circuit 250, and delays the selected signal for a predetermined time to generate the delayed command signal TCD1 in response to the test mode control signal TM. The third unit delay circuit (DELAY7) 233 selects an output signal TC6 of the command buffer 210 of FIG. 7 or an output signal TTA6 of the latch circuit 250, and delays the selected signal for a predetermined time to generate the delayed command signal TCD6 in response to the test mode control signal TM.

Figure 9:
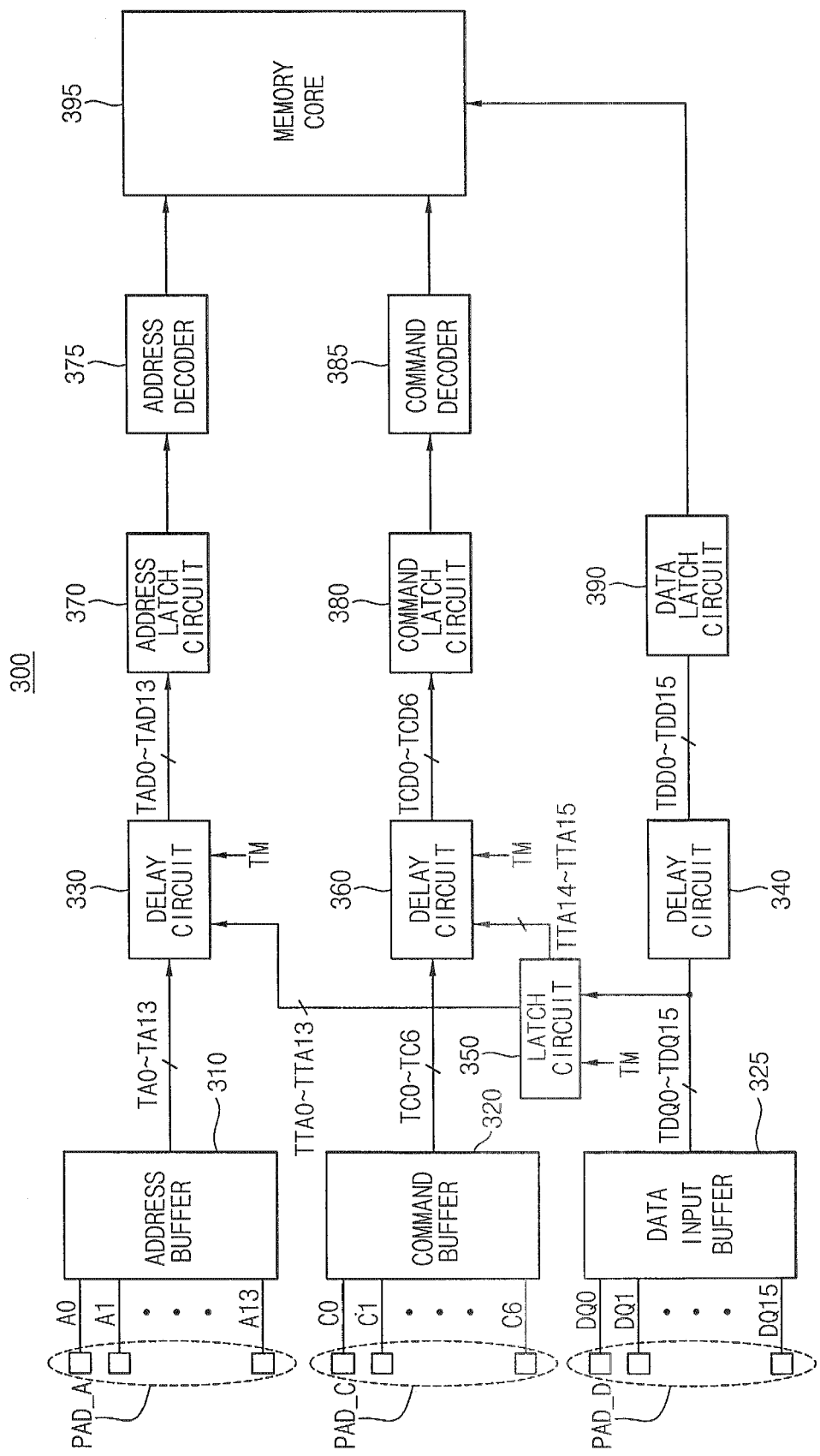
FIG. 9 is a block diagram illustrating a semiconductor memory device according to an exemplary embodiment of the present invention.

FIG. 9 is a block diagram illustrating a semiconductor memory device according to an exemplary embodiment of the present invention.

Referring to FIG. 9, the semiconductor memory device 300 includes address pads PAD_A, commands pads PAD_C, DQ pads PAD_D, an address buffer 310, a command buffer 320, a data input buffer 325, a latch circuit 350, a first delay circuit 330, a second delay circuit 360, and a third delay circuit 340.

The address pads PAD_A are electrically coupled to address pins (not shown), and the command pads PAD_C are electrically coupled to command pins (not shown), and the DQ pads PAD_D are electrically coupled to DQ pins (not shown). In an exemplary embodiment of the present invention address buffer 310 receives address signals A0 to A13 through the address pads PAD_A and buffers the address signals A0 to A13. The command buffer 320 receives command signals C0 to C6 through command pads PAD_C and buffers the command signals C0 to C6. The data input buffer 325 may receive input data DQ0 to DQ15 through the DQ pads PAD_D and may buffer the input data DQ0 to DQ15, or may receive the address signals A0 to A13 and the command signals C5 and C6 through the DQ pads PAD_D and may buffer the address signals A0 to A13 and the command signals C5 and C6. The output signals TDQ0 to TDQ15 of the data input buffer 325 may be the input data DQ0 to DQ15 or the combined signals of the address signals A0 to A13 and the command signals C5 and C6. The latch circuit 350 receives signals TDQ0 to TDQ13, which correspond to address signals A0 to A13 and receives signals TDQ14 and TDQ15, which correspond to the command signals C5 and C6, and latches the signals TDQ0 to TDQ15 in response to the test mode control signal TM.

The first delay circuit 330 selects the output signals TA0 to TA13 of the address buffer 310 or the output signals TTA0 to TTA13 of the latch circuit 350 and delays the selected address signals for a predetermined time to generate delayed address signals TAD0 to TAD13 in response to the test mode control signal TM. The second delay circuit 360 selects the output signals TC0 to TC6 of the command buffer 320 or the output signals TTA14 and TTA15 of the latch circuit 350 and delays the selected command signals for a predetermined time to generate delayed command signals TCD0 to TCD6 in response to the test mode control signal TM. The third delay circuit 340 delays the output signals TDQ0 to TDQ15 of the data input buffer 325 for a predetermined time to generate delayed data TDD0 to TDD15.

In an exemplary embodiment of the present invention, the semiconductor memory device 300 includes an address latch circuit 370, an address decoder 375, a command latch circuit 380, a command decoder 385, a data latch circuit 390 and a memory core 395 including a memory cell array. The address latch circuit 370 latches the delayed address signals TAD0 to TAD13. The address decoder 375 decodes output signals of the address latch circuit 370 to generate decoded address signals and provide the decoded address signals to the memory core 395. The command latch circuit 380 latches the delayed command signals TCD0 to TCD6. The command decoder 385 decodes output signals of the command latch circuit 380 to generate decoded command signals and provide the decoded command signals to the memory core 395. The data latch circuit 390 latches the delayed data TDD0 to TDD15 and provides the latched data to the memory core 395. The output data of the data latch circuit 390 are stored in selected memory cells of the memory cell array based on the output signal of the address decoder 375 and the output signal of the command decoder 385.

Hereinafter, operations of the semiconductor memory device 300, according to an exemplary embodiment of the present invention, will be described with reference to FIG. 9.

In a normal mode, the address signals A0 to A13 are inputted through the address pads PAD_A, the command signals C0 to C6 are inputted through the command pads PAD_C, and the input data DQ0 to DQ15 are inputted through DQ pads PAD_D. The address signals A0 to A13 are buffered by the address buffer 310, delayed for a predetermined time by the first delay circuit 330, and provided to the address latch circuit 370. The command signals C0 to C6 are buffered by the command buffer 310, delayed for a predetermined time by the second delay circuit 360, and provided to the command latch circuit 380.

The input data DQ0 to DQ15 are buffered by the data input buffer 325, delayed for a predetermined time by the third delay circuit 340, and provided to the data latch circuit 390. The output signals of the address latch circuit 370 are decoded by the address decoder 375 and provided to the memory core 395. The data stored temporarily in the data latch circuit 390 are stored in the memory cell array of the memory core 395 in response to the address signals decoded by the address decoder 375.

The command signals C0 to C6 may include a clock signal CLK, an inverted clock signal CLKB, a chip selection signal CSB, a row address strobe signal RASB, a column address strobe signal CASB, a write enable signal WEB and a clock enable signal CKE.

In a test mode, although not shown as such in FIG. 9, the address signals A0 to A13, the command signals C5 and C6 of the command signals C0 to C6 and the input data DQ0 to DQ15 are inputted through the DQ pads PAD_D. The command signals C0 to C4 are inputted through the command pads PAD_C. The address signals A0 to A13 and the command signals C5 and C6 are buffered by the data input buffer 325 and latched by the latch circuit 350. The latch circuit 350 latches the output signals TDQ0 to TDQ15 of the data input buffer 325 to generate the signals TTA0 to TTA13, which correspond to the address signals A0 to A13, and the signals TTA14 and TTA15, which correspond to the command signals C5 and C6 in response to the test mode control signal TM.

The first delay circuit 330 delays the output signals TA0 to TA13 of the address buffer 310, and the output signals TTA0 to TTA13 of the latch circuit 350, which correspond to the address signals A0 to A13, for a predetermined time and provides the delayed address signals to the address latch circuit 370 in response to the test mode control signal TM. The second delay circuit 360 delays the output signals TC0 to TC6 of the command buffer 320, and the output signals TTA14 and TTA15 of the latch circuit 350, which correspond to the command signals C5 to C6, for a predetermined time and provides the delayed command signals to the command latch circuit 380 in response to the test mode control signal TM.

The input data DQ0 to DQ15 are buffered by the data input buffer 325, delayed for a predetermined time by the third delay circuit 340, and provided to the data latch circuit 390. The output signals of the address latch circuit 370 are decoded by the address decoder 375 and provided to the memory core 395. The output signals of the command latch circuit 380 are decoded by the command decoder 385 and provided to the memory core 395.

The data stored temporarily in the data latch circuit 390 are stored in the memory cell array of the memory core 395 in response to the address signals decoded by the address decoder 375 and the command signals decoded by the command decoder 385. The data stored in the memory core 395 are outputted through the output buffer (not shown) and DQ pads PAD_D during the data read operation.

According to an exemplary embodiment of the present invention, in the test mode, test efficiency of a semiconductor memory device may be increased by applying address signals and some of the command signals through the DQ pads PAD_D. For example, a test system including the semiconductor memory device 300 described in connection with FIG. 9 may test an increased number of semiconductor memory devices in a given time.

Figure 10:
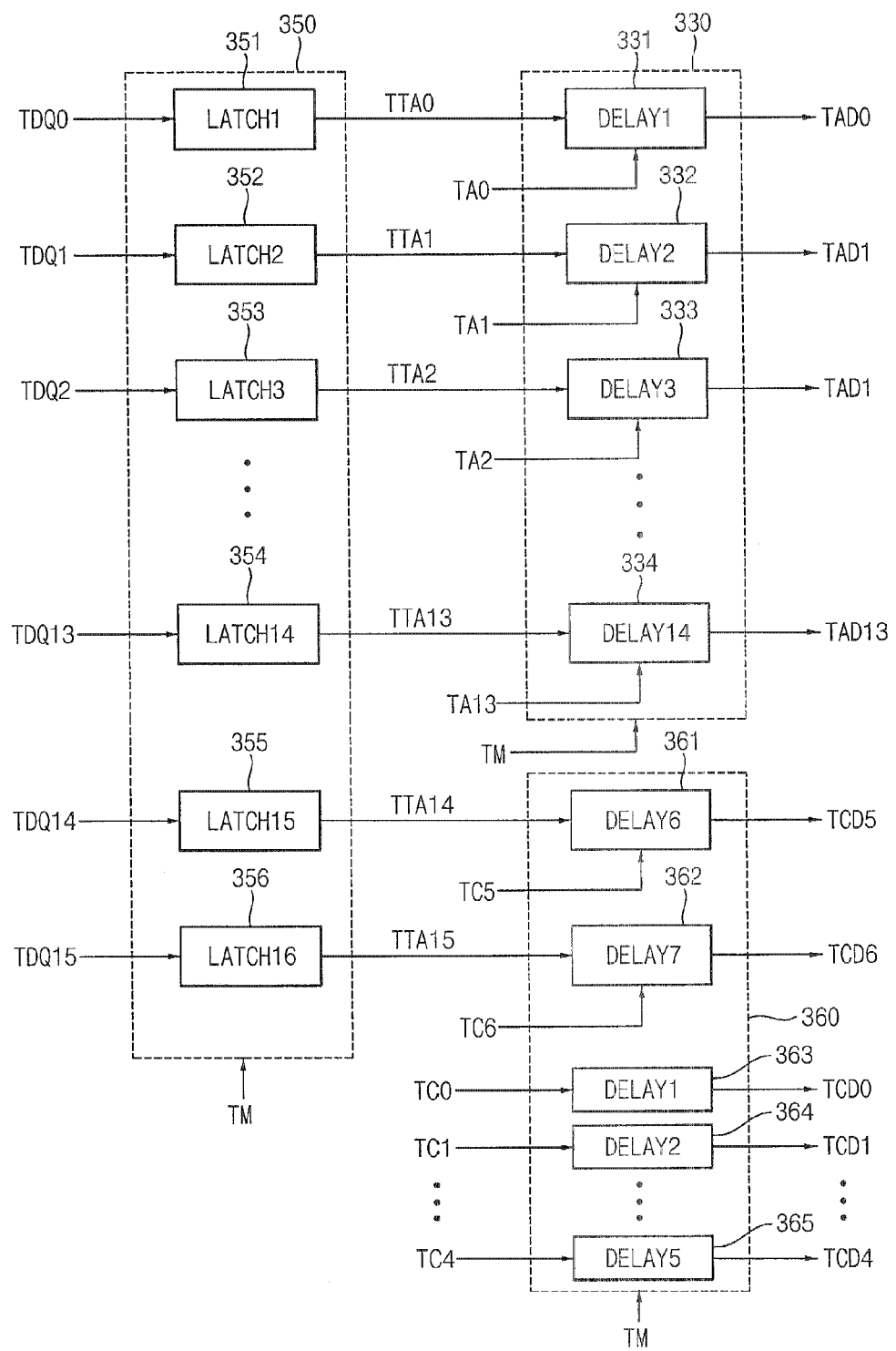
FIG. 10 is a block diagram illustrating a latch circuit and delay circuits of the semiconductor memory device shown in FIG. 9, according to an exemplary embodiment of the present invention.

FIG. 10 is a block diagram illustrating the latch circuit 350 and the delay circuits 330 and 360 of the semiconductor memory device 300 shown in FIG. 9, according to an exemplary embodiment of the present invention.

Referring to FIG. 10, the latch circuit 350 includes a plurality of unit latch circuits, such as for example, a first unit latch circuit 351, a second unit latch circuit 352, a third unit latch circuit 353, a fourth unit latch circuit 354, a fifth unit latch circuit 355, and a sixth unit latch circuit 356. The first unit latch circuit (LATCH1) 351 receives and latches the signal TDQ0 to output the signal TTA0 in response to the test mode control signal TM. The second unit latch circuit (LATCH2) 352 receives and latches the signal TDQ1 to output the signal TTA1 in response to the test mode control signal TM. The third unit latch circuit (LATCH16) 356 receives and latches the signal TDQI5 to output the signal TTA15 in response to the test mode control signal TM.

The first delay circuit 330 includes a plurality of unit delay circuits, such as for example, a unit delay circuit 331, a second unit delay circuit 332, a third unit delay circuit 333, and a fourth unit delay circuit 334. The first unit delay circuit (DELAY1) 331 selects an output signal TA0 of the address buffer 310 of FIG. 9 or an output signal TTA0 of the latch circuit 350, and delays the selected signal for a predetermined time to generate the delayed address signal TAD0 in response to the test mode control signal TM. The second unit delay circuit (DELAY2) 332 selects an output signal TA1 of the address buffer 310 of FIG. 9 or an output signal TTA1 of the latch circuit 350, and delays the selected signal for a predetermined time to generate the delayed address signal TAD1 in response to the test mode control signal TM. The fourth unit delay circuit (DELAY14) 334 selects an output signal TA13 of the address buffer 310 of FIG. 1 or an output signal TTA13 of the latch circuit 350, and delays the selected signal for a predetermined time to generate the delayed address signal TAD13 in response to the test mode control signal TM.

The second delay circuit 360 includes a plurality of unit delay circuits, such as for example, a first unit delay circuit 363, a second unit delay circuit 364, a third unit delay circuit 365, a fourth unit delay circuit 361, and a fifth unit delay circuit 362. The first unit delay circuit (DELAY1) 363 delays an output signal TC0 of the command buffer 320, described in connection with FIG. 9, for a predetermined time to generate the delayed command signal TCD0. The second unit delay circuit (DELAY2) 364 delays an output signal TC1 of the command buffer 320 of FIG. 9 for a predetermined time to generate the delayed command signal TCD1. The third unit delay circuit (DELAY5) 365 delays an output signal TC4 of the command buffer 320 of FIG. 9 for a predetermined time to generate the delayed command signal TCD4. The fourth unit delay circuit 23 (DELAY6) 361 selects an output signal TC5 of the command buffer 320 of FIG. 9 or an output signal TTA14 of the latch circuit 350, and delays the selected signal for a predetermined time to generate the delayed command signal TCD5 in response to the test mode control signal TM. The fifth unit delay circuit (DELAY7) 362 selects an output signal TC6 of the command buffer 320 of FIG. 9 or an output signal TTA15 of the latch circuit 350, and delays the selected signal for a predetermined time to generate the delayed command signal TCD6 in response to the test mode control signal TM.

Figure 11:
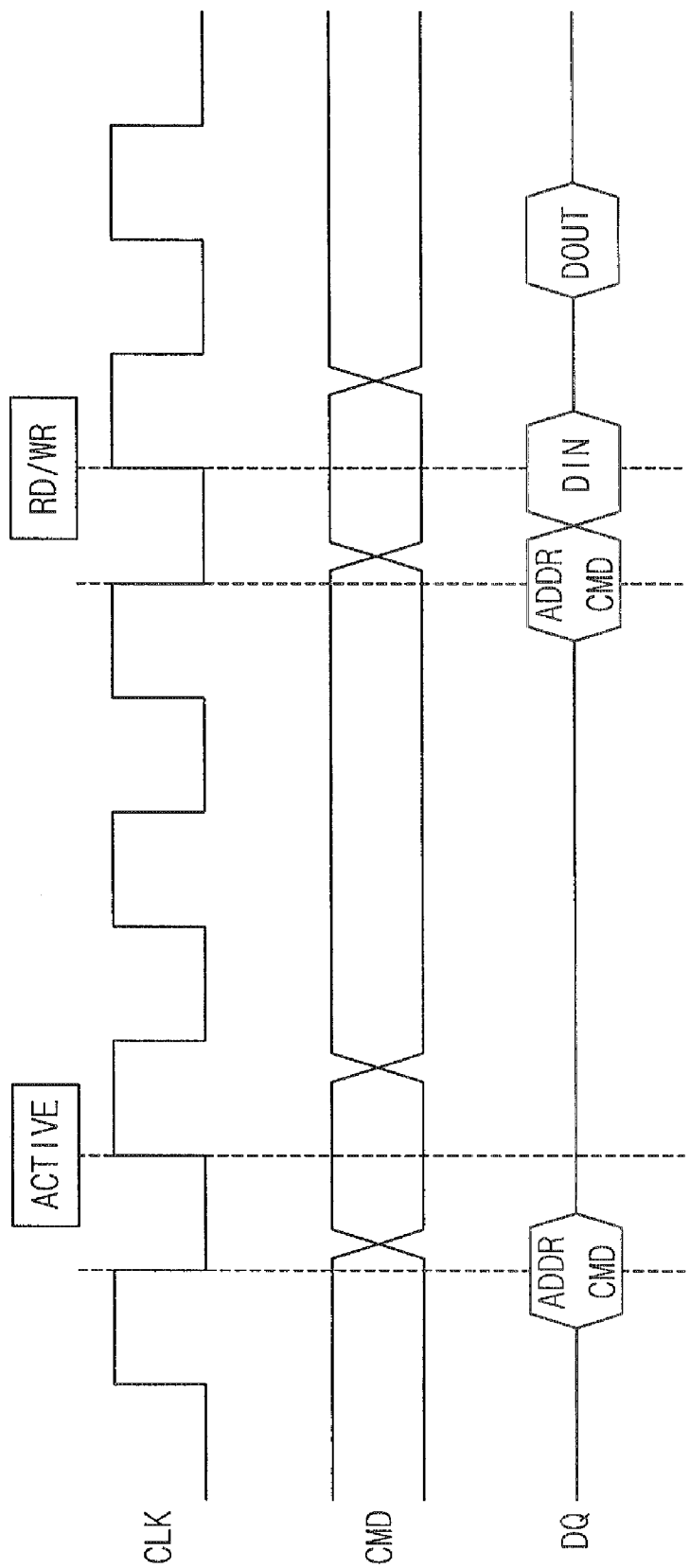
FIG. 11 is timing diagram for the semiconductor memory device shown in FIG. 9 when the semiconductor memory device operates in the test mode.

FIG. 11 is timing diagram for the semiconductor memory device shown in FIG. 9 when the semiconductor memory device operates in the test mode.

In FIG. 11, a clock signal CLK, a command signal CMD and a signal of the DQ pad DQ are shown. Referring to FIG. 11, the address signals ADDR and a first set of the command signals CMD are inputted together through the DQ pads PAD_D at the falling edge of the clock signal CLK before the active command ACTIVE is inputted and a second set of the command signals CMD are inputted at the rising edge of the clock signal CLK when the active command ACTIVE is inputted. In an exemplary embodiment of the present invention, the address signals ADDR and a first set of the command signals CMD are inputted together through the DQ pads PAD_D at the failing edge of the clock signal CLK before the write command WR is inputted, and a second set of the command signals CMD are inputted at the rising edge of the clock signal CLK when the write command WR is inputted. Input data DIN may be inputted at the rising edge of the clock signal CLK when the write command WR is inputted. When the read command RD is inputted, the address signals ADDR and a first set of the command signals CMD are inputted together through the DQ pads PAD_D, and the output data DOUT are outputted.

Figure 12:
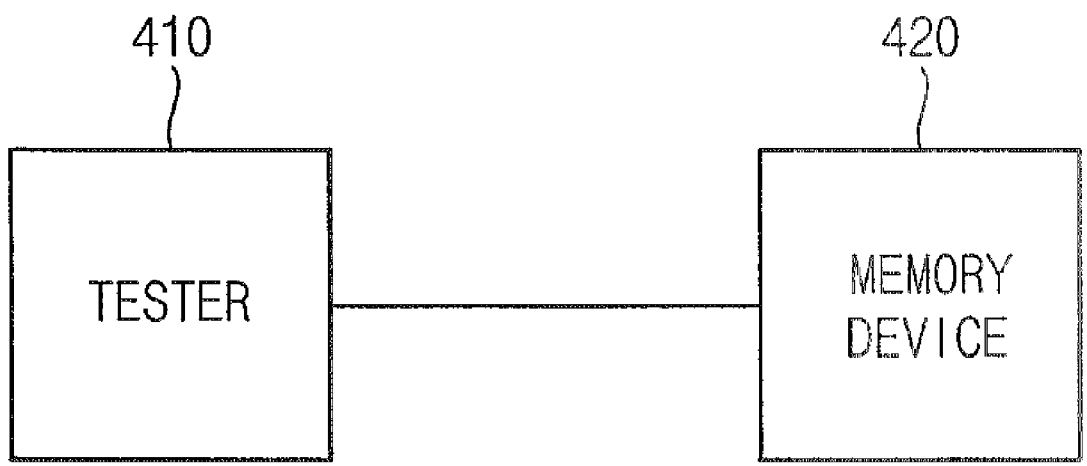
FIG. 12 is block diagram illustrating a test system including a semiconductor memory device according to an exemplary embodiment of the present invention.

FIG. 12 is block diagram illustrating a test system including a semiconductor memory device according to exemplary embodiments of the present invention.

Referring to FIG. 12 the semiconductor memory test system 400 includes a semiconductor memory device 420 and a tester 410.

The semiconductor memory device 420 may be a semiconductor memory device according to an exemplary embodiment of the present invention shown in FIG. 1, FIG. 7 or FIG. 9, and may include a plurality of address pads, a plurality of command pads and a plurality of DQ pads.

The tester 410 provides address signals, command signals and input data to the semiconductor memory device through the DQ pads, and tests operations of the semiconductor memory device 420.

Hereinafter, a method of testing a semiconductor memory device 420 using the semiconductor memory test system 400 shown in FIG. 12 will be described.

A method of testing a semiconductor memory device, according to an exemplary embodiment of the present invention, includes receiving a plurality of address signals and at least one command signal from a tester through the plurality of DQ pads, receiving a plurality of input data from the tester through the plurality of DQ pads, buffering the plurality of address signals and the at least one command signal to generate first address signals and first command signals, latching the first address signals and the first command signals to generate second address signals and second command signals in a test mode, delaying the second address signals for a predetermined time to generate third address signals in the test mode, delaying the second command signals for a predetermined time to generate third command signals in the test mode, writing the plurality of input data to a memory core based on the third address signals and the third command signals in the test mode, and reading data stored in the memory core based on the third address signals and the third command signals in the test mode.

A semiconductor memory device according to an exemplary embodiment of the present invention may be tested using fewer pins than a conventional semiconductor memory device. A semiconductor memory device according to an exemplary embodiment of the present invention receives address signals, command signals and data through the DQ pads in the test mode. A test system including the semiconductor memory device according to an exemplary embodiment of the present invention may test an increased number of semiconductor memory devices at a time and a test time may be decreased.

Although exemplary embodiments of the present invention have been described in detail with reference to the accompanying drawings for the purpose of illustration, it is to be understood that the inventive processes and apparatus should not be construed as limited thereby. It will be apparent to those of ordinary skill in the art that various modifications to the foregoing exemplary embodiments can be made without departing from the scope of the invention as defined by the appended claims, with equivalents of the claims to be included therein.

What is claimed is:

1. A semiconductor memory device comprising:
a plurality of address pads;
a plurality of DQ pads;
an address buffer configured to receive a plurality of first address signals through the address pads and configured to buffer the first address signals to generate a plurality of second address signals;
a data input buffer configured to receive through the DQ pads and to buffer one of a plurality of input data to generate a first data or the first address signals to generate a plurality of third address signals;
a latch circuit configured to latch the third address signals to generate fourth address signals; and
a first delay circuit configured to select the second address signals or the fourth address signals and delay the selected address signals for a predetermined time to generate fifth address signals.

2. The semiconductor memory device of claim 1, wherein the latch circuit is configured to latch the second address signals to generate the third address signals in response to a test mode control signal.

3. The semiconductor memory device of claim 2, wherein the test mode control signal is a mode register set signal.

4. The semiconductor memory device of claim 1, further comprising a second delay circuit configured to delay the first data for a predetermined time to generate a second data.

5. The semiconductor memory device of claim 4, further comprising
a memory core;
an address latch circuit configured to latch the fifth address signals;
an address decoder configured to decode output signals of the address latch circuit to generate decoded address signals and provide the decoded address signals to the memory core; and
a data latch circuit configured to latch the second data and provide the latched data to the memory core.

6. A semiconductor memory device comprising:
a plurality of command pads;
a plurality of DQ pads;
a command buffer configured to receive a plurality of first command signals through the plurality of command pads and configured to buffer the plurality of command signals to generate second command signals;
a data input buffer configured to receive through the DQ pads and to buffer one of a plurality of input data to generate a first data or the first command signals to generate third command signals;
a latch circuit configured to latch the third command signals to generate fourth command signals; and
a first delay circuit configured to select the second command signals or the fourth command signals and delay the selected command signals for a predetermined time to generate fifth command signals.

7. The semiconductor memory device of claim 6, wherein the latch circuit configured to latch the second command signals to generate the fourth command signals in response to the test mode control signal.

8. The semiconductor memory device of claim 7, wherein the test mode control signal is a mode register set signal.

9. The semiconductor memory device of claim 6, further comprising a second delay circuit configured to delay the first data for a predetermined time to generate a second data.

10. The semiconductor memory device of claim 9, further comprising:
a memory core;
a command latch circuit configured to latch the fifth command signals;
a command decoder configured to decode output signals of the command latch circuit to generate decoded command signals and provide the decoded command signals to the memory core; and
a data latch circuit configured to latch the second data and provide the latched data to the memory core.

11. A semiconductor memory device comprising:
a plurality of address pads;
a plurality of command pads;
a plurality of DQ pads;
an address buffer configured to receive a plurality of first address signals through the address pads and configured to buffer the first address signals to generate second address signals;
a command buffer configured to receive at least one first command signal through the command pads, and configured to buffer the at least one first command signal to generate second command signals;
a data input buffer configured to receive through the DQ pads and to buffer one of a plurality of input data to generate a first data, or the first address signals and at least one third command signal to generate third address signals and fourth command signals;
a latch circuit configured to latch the third address signals and the fourth command signals to generate fourth address signals and fifth command signals in response to a test mode control signal;
a first delay circuit configured to select the second address signals or the fourth address signals and delay the selected address signals for a predetermined time to generate fifth address signals; and
a second delay circuit configured to select the second command signals or the fifth command signals and delay the selected address signals by a predetermined time to generate sixth command signals.

12. The semiconductor memory device of claim 11, wherein the fourth address signals are configured to correspond to the plurality of address signals, and the fifth command signals are configured to correspond to the at least one third command signal.

13. The semiconductor memory device of claim 11, wherein the latch circuit configured to latch the third address signals to generate the fourth address signals when the test mode control signal is enabled.

14. The semiconductor memory device of claim 13, wherein the test mode control signal is a mode register set signal.

15. The semiconductor memory device of claim 11, further comprising a third delay circuit configured to delay the first data for a predetermined time to generate a second data.

16. The semiconductor memory device of claim 15, further comprising:
   a memory core;
   an address latch circuit configured to latch the fifth address signals;
   an address decoder configured to decode output signals of the address latch circuit to generate decoded address signals, and provide the decoded address signals to the memory core;
   a command latch circuit configured to latch the sixth command signals;
   a command decoder configured to decode output signals of the command latch circuit to generate decoded command signals, and provide the decoded command signals to the memory core; and
   a data latch circuit configured to latch the second data and provide the latched data to the memory core.

17. A method of testing a semiconductor memory device, comprising:
   receiving a plurality of address signals and at least one command signal from a tester through a plurality of DQ pads;
   receiving a plurality of input data from the tester through the DQ pads;
   buffering the address signals and the at least one command signal to generate first address signals and first command signals;
   latching the first address signals and the first command signals to generate second address signals and second command signals in a test mode;
   delaying the second address signals for a predetermined time to generate third address signals in the test mode;
   delaying the second command signals for a predetermined time to generate third command signals in the test mode;
   writing the input data to a memory core based on the third address signals and the third command signals in the test mode; and
   reading data stored in the memory core based on the third address signals and the third command signals in the test mode.

* * * * *